(12) United States Patent
Voronov et al.

(10) Patent No.: US 9,065,054 B2
(45) Date of Patent: Jun. 23, 2015

(54) METHOD OF FORMING ORGANIC LIGHT EMITTING PATTERN AND APPARATUS FOR FORMING ORGANIC LIGHT EMITTING PATTERN OF ORGANIC ELECTRO-LUMINESCENCE DISPLAY USING SUBLIMATION TYPE THERMAL TRANSFER METHOD

(71) Applicant: Samsung Display Co., Ltd., Yongin, Gyeonggi-Do (KR)

(72) Inventors: Alexander Voronov, Yongin (KR); Gyoo-Wan Han, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/225,143

(22) Filed: Mar. 25, 2014

(65) Prior Publication Data
US 2014/0295601 A1 Oct. 2, 2014

(30) Foreign Application Priority Data
Mar. 27, 2013 (KR) ........................ 10-2013-0033062

(51) Int. Cl.
*H01L 51/00* (2006.01)

(52) U.S. Cl.
CPC ................................. *H01L 51/0013* (2013.01)

(58) Field of Classification Search
CPC ............ H01L 51/0013; H01L 27/3211; H01L 27/3244; H01L 51/0004; H01L 51/001; H01L 51/005; H01L 51/0081; H01L 51/56
USPC .......... 438/46; 118/624; 204/192.1; 427/469, 427/66, 70
See application file for complete search history.

(56) References Cited

U.S. PATENT DOCUMENTS

| 6,140,009 | A | 10/2000 | Wolk et al. |
| 6,221,553 | B1 | 4/2001 | Wolk et al. |
| 6,291,126 | B2 | 9/2001 | Wolk et al. |
| 8,537,600 | B2 * | 9/2013 | Matsubayashi ............... 365/149 |
| 8,675,394 | B2 * | 3/2014 | Matsubayashi ............... 365/149 |
| 2005/0266186 | A1 * | 12/2005 | Nguyen et al. ............. 428/32.77 |
| 2006/0127565 | A1 * | 6/2006 | Becker et al. .................... 427/66 |
| 2010/0172098 | A1 * | 7/2010 | Isoshima et al. .............. 361/697 |
| 2011/0159201 | A1 | 6/2011 | Park |
| 2014/0295601 | A1 * | 10/2014 | Voronov et al. ................. 438/46 |

FOREIGN PATENT DOCUMENTS

| JP | 09-204984 | 8/1997 |
| JP | 2003-257638 | 9/2003 |
| JP | 2006-502543 | 1/2006 |

* cited by examiner

*Primary Examiner* — Stephen W Smoot
*Assistant Examiner* — Edward Chin
(74) *Attorney, Agent, or Firm* — Robert E. Bushnell, Esq.

(57) ABSTRACT

A method of forming an organic light emitting pattern of an organic electro-luminescence display according to an exemplary embodiment of the present invention includes preparing a display substrate in which a region where a first organic light emitting material is to be formed is defined, preparing a temporal transfer substrate (TTS) that is a transfer subject on which the first organic light emitting material is to be transferred, forming the first organic light emitting material on the temporal transfer substrate, applying heat to a portion other than a first region of the temporal transfer substrate to remove the first organic light emitting material formed on the portion other than the first region, disposing the temporal transfer substrate and the display substrate to closely face each other, and applying heat to the temporal transfer substrate to transfer the organic light emitting material on the display substrate.

34 Claims, 7 Drawing Sheets

FIG. 2
(a)
(b)
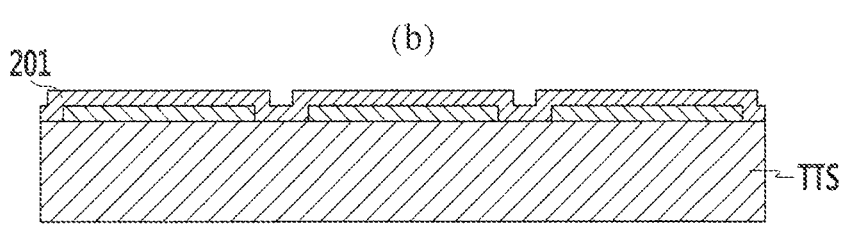
(c)
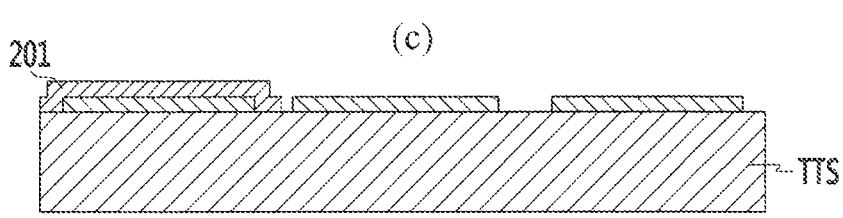
(d)
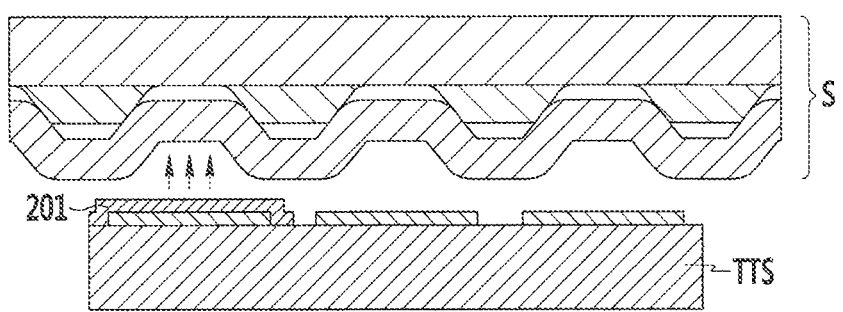

METHOD OF FORMING ORGANIC LIGHT EMITTING PATTERN AND APPARATUS FOR FORMING ORGANIC LIGHT EMITTING PATTERN OF ORGANIC ELECTRO-LUMINESCENCE DISPLAY USING SUBLIMATION TYPE THERMAL TRANSFER METHOD

CLAIM OF PRIORITY

This application claims priority to and the benefit of Korean Patent Application No. 10-2013-0033062 filed in the Korean Intellectual Property Office on Mar. 27, 2013, the entire contents of which are incorporated herein by reference.

BACKGROUND OF THE INVENTION

1. Field of the Invention

The present description relates to a method of forming an organic light emitting pattern and an apparatus for forming the organic light emitting pattern of an organic electro-luminescence display, and more particularly, to a method of forming an organic light emitting pattern and an apparatus for forming the organic light emitting pattern using a sublimation type thermal transfer method.

2. Description of the Related Art

A current organic electro-luminescence display is a self-light emitting type and does not require a backlight unlike a liquid crystal display (LCD), and thus weight reduction and slimness thereof are feasible and the organic electro-luminescence display can be manufactured through a simple process to increase price competitiveness. Further, the organic electro-luminescence display has low voltage driving, high luminous efficiency, and a wide viewing angle, thus receiving attention as a next generation display.

The organic electro-luminescence display includes a plurality of pixels to display an image. Each pixel includes an anode, an organic emission layer, and a cathode. In the case where the anode and the cathode provide holes and electrons to the organic emission layer, the holes and the electrons are recombined in the organic emission layer to form an exciton, and light having a predetermined wavelength is formed while the exciton falls to a stable bottom state. Herein, lights having wavelengths corresponding to red, green, and blue colors may be formed according to a material characteristic of the organic emission layer.

In the organic electro-luminescence display, each organic emission layer implementing red (R), green (G), and blue (B) colors should be patterned for each pixel in order to implement full colors. Herein, a deposition process using a shadow mask may be used in order to pattern the organic emission layer for each pixel.

However, in the deposition process using the shadow mask, it is difficult to obtain a fine pattern and it is also difficult to apply the deposition process to a large area substrate due to a limitation of equipment. Further, since the shadow mask should be frequently replaced, there are problems in that a process time and process cost are increased. Further, since an interval between the substrate and a source should be increased to form a uniform thickness of the organic emission layer, there is a problem in that deposition using efficiency of a material forming the organic emission layer is reduced.

Accordingly, a sublimation type thermal transfer method using a thermal transfer substrate instead of the shadow mask has been developed. However, if localized heat is applied over a short period of time for a high resolution, it is difficult to deposit a high-quality organic layer due to a high sublimation ratio of the deposition material, and on the other hand, slow heating reduces the resolution.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method of implementing a high resolution of an organic electro-luminescence display by a thermal sublimation process without using a shadow mask.

Further, the present invention has been made in an effort to provide a method of forming a structure of a red (R), green (G), and blue (B) pixel layers, or a multilayer by a single process.

Further, the present invention has been made in an effort to provide a method of controlling a sublimation ratio according to a temperature and space change on a transfer substrate.

Further, the present invention has been made in an effort to provide a method of controlling a sublimation ratio and transplanting a deposition material by controlling a current.

An exemplary embodiment of the present invention provides a method of forming an organic light emitting pattern of an organic electro-luminescence display, including: a substrate preparing step of preparing a display substrate in which a region where a first organic light emitting material is to be formed is defined, and preparing a temporal transfer substrate (TTS) that is a transfer subject on which the first organic light emitting material is to be transferred; a first organic light emitting material forming step of forming the first organic light emitting material on the temporal transfer substrate; a first heating step of applying heat to a portion other than a first region of the temporal transfer substrate to remove the first organic light emitting material formed on the portion other than the first region; a substrate disposal step of disposing the temporal transfer substrate and the display substrate to closely face each other; and a transfer heating step of applying heat to the temporal transfer substrate to transfer the organic light emitting material on the display substrate by sublimation.

The first heating step may be performed such that vaporizes the first organic light emitting material formed on the portion other than the first region on the temporal transfer substrate, and may be performed such that does not affect the first organic light emitting material formed on the first region on the temporal transfer substrate.

The transfer heating step may be performed such that vaporizes the first organic light emitting material formed on the temporal transfer substrate.

The transfer heating step may be performed at a temperature at which a vaporization ratio at which the first organic light emitting material formed on the temporal transfer substrate is transferred on the display substrate is 1000 Å/sec or less.

The first heating step may be performed at a temperature at which a vaporization ratio at which the first organic light emitting material formed on the temporal transfer substrate is transferred on the display substrate is 1000 Å/sec or more.

In the first heating step, the temporal transfer substrate may be heated by locally passing a current through resistor elements to generate heat.

The resistor elements may be formed of wires or a set of wires.

The resistor elements may have a mesh structure.

The resistor elements may be connected to matrix wires that do not cross each other.

The temperature and a temperature change of the first heating step and the transfer heating step may be controlled by a change of the current passing through the resistor elements.

A sublimation ratio may be controlled by the temperature.

The display substrate may include an organic light emitting diode (OLED) display device.

The temperature of the temporal transfer substrate may be constantly maintained by adjusting the current.

The temporal transfer substrate may be heated by a plurality of repeated heating pulses.

The temporal transfer substrate and the display substrate may be spaced apart from each other by pin spacers.

A distance between the pin spacers may be longer than a heat diffusion distance in the display substrate.

The temporal transfer substrate may have a structure including an upper insulation layer and a lower thermal conductive layer.

The method of forming an organic light emitting pattern of an organic electro-luminescence display may further include: after the first heating step, a second organic light emitting material forming step of forming a second organic light emitting material on the temporal transfer substrate; a second heating step of applying heat to a portion other than the first region and a second region of the temporal transfer substrate to remove the second organic light emitting material formed on the portion other than the first region and the second region of the temporal transfer substrate; a third organic light emitting material forming step of forming a third organic light emitting material on the temporal transfer substrate; and a third heating step of heating the temporal transfer substrate to remove the second and third organic light emitting materials in the first region on the temporal transfer substrate and remove the third organic light emitting material in the second region on the temporal transfer substrate.

The first heating step to the third heating step may be performed such that vaporizes the removed organic light emitting material on the temporal transfer substrate, and may be performed such that does not affect the organic light emitting material remaining on the temporal transfer substrate.

The transfer heating step may be performed such that vaporizes the first to third organic light emitting materials formed on the temporal transfer substrate.

The transfer heating step may be performed at a temperature at which a vaporization ratio at which the first to third organic light emitting materials formed on the temporal transfer substrate are transferred on the display substrate is 1000 Å/sec or less.

The first heating step to the third heating step may be performed at a temperature at which a vaporization ratio of the first to third organic light emitting materials formed in a region on the temporal transfer substrate is 1000 Å/sec or more.

In the first heating step to the third heating step, the temporal transfer substrate may be heated by locally passing a current through resistor elements to generate heat.

The resistor elements may be formed of wires or a set of wires.

The resistor elements may have a mesh structure.

The resistor elements may be connected to matrix wires that do not cross each other.

The temperature and a temperature change of the first heating step to the third heating step and the transfer heating step may be controlled by a change of the current passing through the resistor elements.

A sublimation ratio may be controlled by the temperature.

The display substrate may include an organic light emitting diode (OLED) display device.

The temperature of the temporal transfer substrate may be constantly maintained by adjusting the current.

The temporal transfer substrate may be heated by a plurality of repeated heating pulses.

The temporal transfer substrate and the display substrate may be spaced apart from each other by pin spacers.

A distance between the pin spacers may be longer than a heat diffusion distance in the display substrate.

The temporal transfer substrate may have a structure including an upper insulation layer and a lower thermal conductive layer.

According to the exemplary embodiments of the present invention, it is possible to form a high resolution structure pattern of an organic light emitting material by deposition without using a mask.

Further, it is possible to form an elaborate pattern due to a low deposition ratio.

Further, it is possible to deposit red (R), green (G) and blue (B) pixel patterns in a single process. Further, it is possible to form an entire structure of a hole transport layer (HTL) and the R, G, and B pixel patterns.

Further, it is possible to variously control the deposition ratio of each pixel by controlling a current.

Further, there is provided a rapid and simplified process of depositing an organic light emitting layer having durability.

Further, it is possible to promote an effective use of a deposition material.

BRIEF DESCRIPTION OF THE DRAWINGS

FIGS. 2(a) to 2(d) are process cross-sectional views illustrating the method of forming the organic light emitting pattern of the organic electro-luminescence display according to the exemplary embodiment of the present invention.

DETAILED DESCRIPTION OF THE EMBODIMENTS

Figure 1:
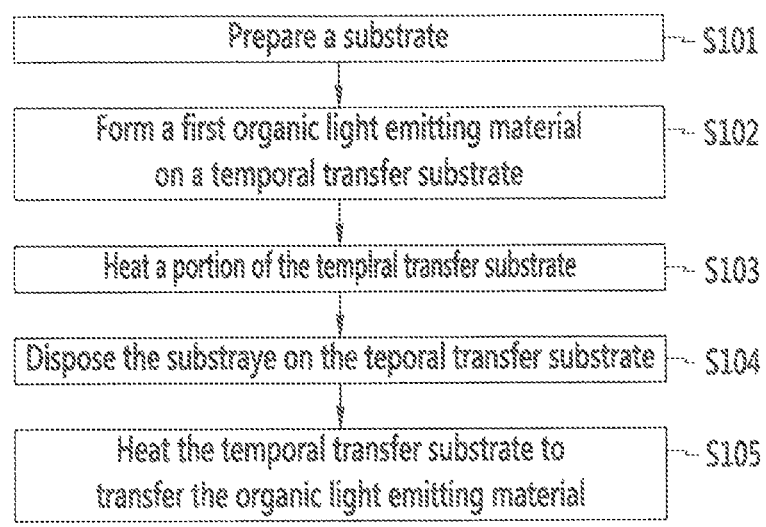
FIG. 1 is a flowchart illustrating a method of forming an organic light emitting pattern of an organic electro-luminescence display according to an exemplary embodiment of the present invention.

Hereinafter, exemplary embodiments of the present invention will be described more fully with reference to the accompanying drawings, in which exemplary embodiments of the invention are shown. As those skilled in the art would realize, the described embodiments may be modified in various different ways, all without departing from the spirit or scope of the present invention.

In addition, in various exemplary embodiments, the same reference numerals are used in respects to the constituent elements having the same constitution and illustrated in the first exemplary embodiment, and in the other exemplary embodiment, only constitution that is different from the first exemplary embodiment is illustrated.

It is described that the drawings are schematic and are not dimensionally illustrated. Relative dimensions and ratios of portions of the drawings are exaggerated or reduced in size for clarity and convenience, and a predetermined dimension is just illustrative but not limitative. In addition, the same reference numerals designate the two or more same structures, elements, or parts illustrated in the drawings in order to exhibit similar characteristics. It will be understood that when an element is referred to as being "on" or "over" another element, it can be directly on the other element or intervening elements may also be present.

An exemplary embodiment of the present invention specifically illustrates one exemplary embodiment of the present invention. As a result, various modifications of the drawings are expected. Accordingly, the exemplary embodiment is not limited to a specific form of the illustrated region, and for example, includes a modification of a form by manufacturing.

Hereinafter, a method of forming an organic light emitting pattern of an organic electro-luminescence display according to an exemplary embodiment of the present invention will be described with reference to FIGS. 1 and 2.

FIG. 1 is a flowchart illustrating a method of forming an organic light emitting pattern of an organic electro-luminescence display according to an exemplary embodiment of the present invention, and FIGS. 2(a) to 2(d) are process cross-sectional views illustrating the method of forming the organic light emitting pattern of the organic electro-luminescence display according to the exemplary embodiment of the present invention.

Referring to FIGS. 1 and 2, first, a display substrate (S) and a temporal transfer substrate (TTS) are prepared (S101) (FIG. 2(a)). In the display substrate (S), a region in which a first organic light emitting material 201 of the organic electro-luminescence display is to be formed is defined, and the temporal transfer substrate (TTS) is a substrate acting as a transfer subject on which the first organic light emitting material 201 is to be transferred. The display substrate (S) may be the organic electro-luminescence display substrate including an organic light emitting diode (OLED) display device, and the temporal transfer substrate (TTS) may have a structure including an upper insulation layer and a lower thermal conductive layer.

The first organic light emitting material 201 is formed on the prepared temporal transfer substrate (TTS) (S102) (FIG. 2(b)). The first organic light emitting material 201 may be made of an organic material intrinsically emitting red (R), green (G), and blue (B) lights. Process cross-sectional views of FIGS. 2(a) to 2(d) illustrate formation of the red organic light emitting pattern with the first organic light emitting material 201, and the first organic light emitting material 201 may be used by a method such as sputtering, dice coating, spin coating, vacuum thermal vapor deposition, or organic vapor phase deposition (OVPD) using carrier gas. Moreover, the pattern may be formed by various known deposition methods. In this case, the first organic light emitting material 201 is totally deposited on the temporal transfer substrate (TTS) corresponding to the red, green, and blue light emitting regions on the display substrate (S).

Thereafter, a portion of the temporal transfer substrate (TTS) is heated in order to allow only the first organic light emitting material 201 to remain in the first region on the temporal transfer substrate (TTS) (S103) (FIG. 2(c)). Heat is applied to a region on which the organic light emitting material 201 of the display substrate (S) is not transferred, that is, a region other than a first region on the temporal transfer substrate (TTS), to remove the first organic light emitting material 201 formed on a portion other than the first region.

In this case, a heating time (or heating duration) is long enough to vaporize the first organic light emitting material 201 formed on the portion other than the first region on the temporal transfer substrate (TTS), that is, the red organic light emitting material of the green and blue light emitting regions, and is short enough not to affect the first organic light emitting material 201 formed on the first region on the temporal transfer substrate (TTS). For example, in this case, heating may be performed at a heating temperature at which a vaporization ratio at which the first organic light emitting material 201 formed on the temporal transfer substrate (TTS) is transferred on the display substrate (S) is 1000 Å/sec or more.

Thereafter, in a state where the first organic light emitting material 201 formed in the green and blue light emitting regions on the temporal transfer substrate (TTS) is removed, the temporal transfer substrate (TTS) and the display substrate (S) are disposed to closely face each other (S104). In this case, the temporal transfer substrate (TTS) and the display substrate (S) may be spaced apart from each other at a regular interval by pin spacers 405. A distance between the pin spacers 405 may be set to be longer than a heat diffusion distance in the display substrate (S) to prevent heat from affecting the region where heating is not required. The heat diffusion distance is a distance which a heat in the display substrate (S) is diffused from high temperature location to low temperature point.

Thereafter, heat is applied to the temporal transfer substrate (TTS) to transfer the first organic light emitting material 201 on the region of the display substrate (S), in which the organic light emitting material is to be formed, by sublimation (S105). In this case, the heating time (or heating duration) is long enough to vaporize the first organic light emitting material 201 formed on the temporal transfer substrate (TTS). Further, in this case, heating may be performed at a heating temperature at which a vaporization ratio at which the first organic light emitting material 201 formed on the temporal transfer substrate (TTS) is transferred on the display substrate (S) is 1000 Å/sec or less. That is, the heating temperature is adjusted so that sublimation occurs at a slow speed, and the first organic light emitting material 201 may be deposited by sublimation at a slow speed to reduce porosity of the deposited material and allow deposition of the first organic light emitting material 201 to be uniformly distributed, thus forming a high-quality layer on the display substrate (S).

Thereafter, the temporal transfer substrate (TTS) is separated from the display substrate (S), additional heat is applied to the temporal transfer substrate (TTS) to remove the remaining first organic light emitting material 201 by vaporization, and the temporal transfer substrate (TTS) is re-used through a washing process and the like.

Meanwhile, the temporal transfer substrate (TTS) may be heated by locally passing a current through the resistor elements to generate heat. The resistor elements may be formed of wires or a set of wires, and may have a mesh structure. The resistor elements may be connected to matrix wires that do not cross each other.

The temperature and a temperature change when the temporal transfer substrate (TTS) is heated may be controlled by a change of the current passing through the resistor elements. A sublimation ratio at which the first organic light emitting material 201 is sublimed from the temporal transfer substrate (TTS) to the display substrate (S) may be controlled by the temperature at this time. Further, the temperature of the temporal transfer substrate (TTS) may be constantly maintained by adjusting the current. Further, the temporal transfer substrate (TTS) may be heated by a plurality of repeated heating pulses.

Figure 3:
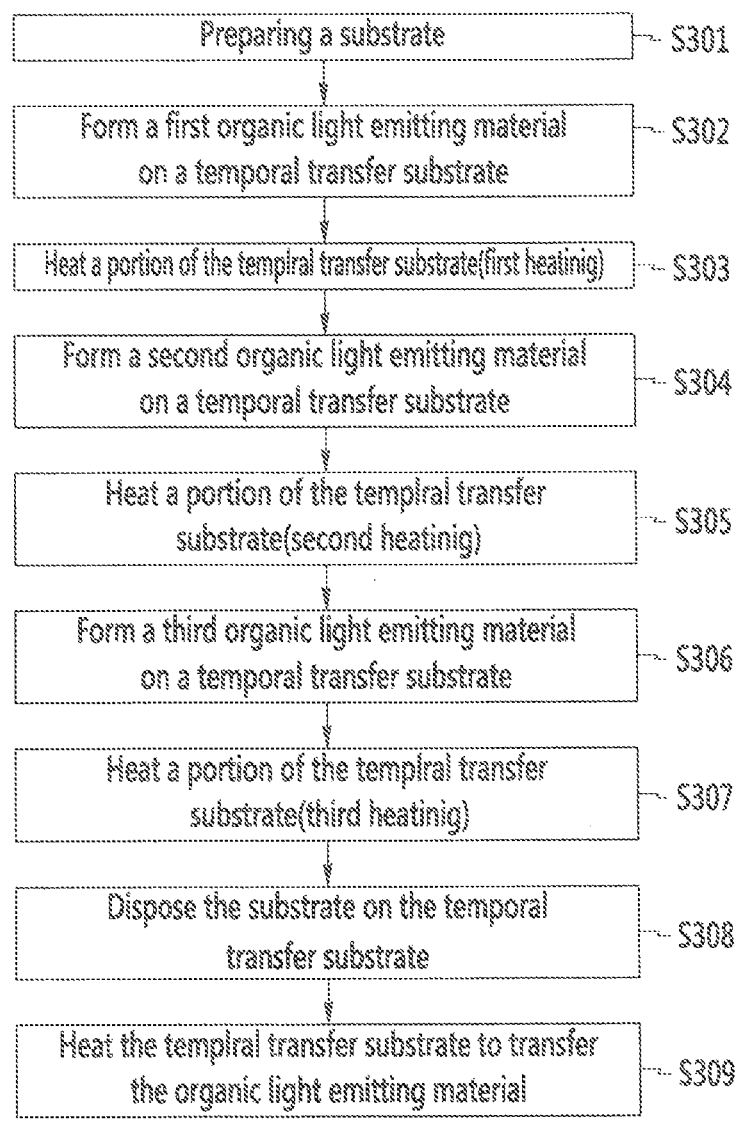
FIG. 3 is a flowchart illustrating a method of forming an organic light emitting pattern of an organic electro-luminescence display according to another exemplary embodiment of the present invention.

FIG. 3 is a flowchart illustrating a method of forming an organic light emitting pattern of an organic electro-luminescence display according to another exemplary embodiment of the present invention, and FIGS. 4(a) to 4(h) are process cross-sectional views illustrating the method of forming the organic light emitting pattern of the organic electro-luminescence display according to another exemplary embodiment of the present invention.

Figure 4:
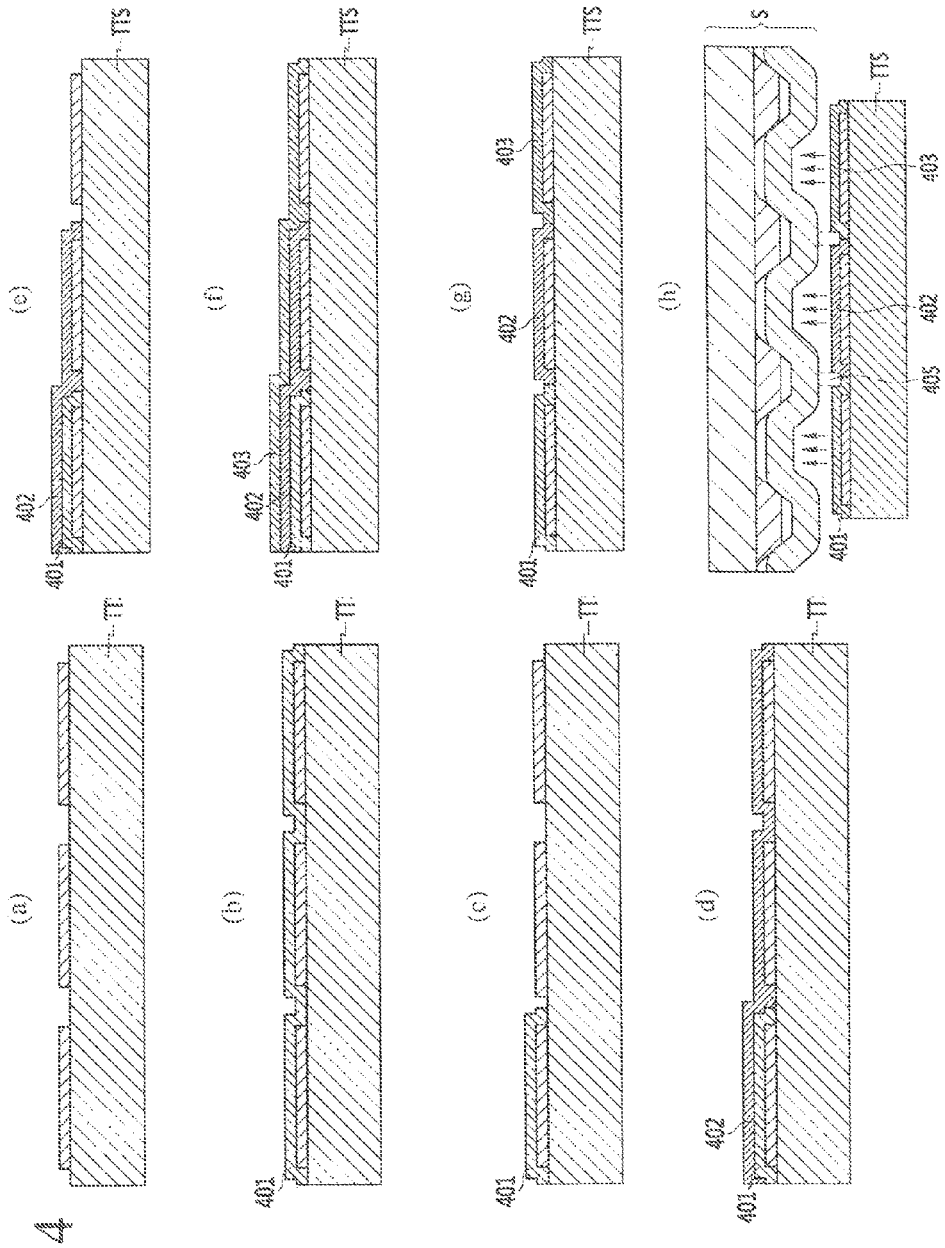
FIGS. 4(a) to 4(h) are process cross-sectional views illustrating the method of forming the organic light emitting pattern of the organic electro-luminescence display according to another exemplary embodiment of the present invention.

Referring to FIGS. 3 and 4, in the method of forming the organic light emitting pattern of the organic electro-luminescence display according to another exemplary embodiment of the present invention, a display substrate (S) in which a region in which an organic light emitting material is to be formed is defined, and a temporal transfer substrate (TTS) that is a transfer subject on which the organic light emitting material is to be transferred are prepared (S301) (FIG. 4(a)). The display substrate (S) may be the organic electro-luminescence display substrate including an organic light emitting diode (OLED) display device, and the temporal transfer substrate (TTS) may have a structure including an upper insulation layer and a lower thermal conductive layer.

Thereafter, a first organic light emitting material 401 is formed on the prepared temporal transfer substrate (TTS) (S302) (FIG. 4(b)). In the present exemplary embodiment, the first organic light emitting material 401 may be formed of a red organic light emitting material, and may be used by a method such as sputtering, dice coating, spin coating, vacuum thermal vapor deposition, or organic vapor phase deposition (OVPD) using carrier gas. Moreover, the pattern may be formed by various known deposition methods.

Thereafter, heat is applied to a portion other than a first region of the temporal transfer substrate (TTS) to remove the first organic light emitting material 401 formed on the portion other than the first region on the temporal transfer substrate (TTS) (S303) (FIG. 4(c)). In the present exemplary embodiment, the first organic light emitting material 401 on the temporal transfer substrate (TTS) corresponding to a region of the display substrate (S), in which green and blue organic light emitting materials are to be formed, is removed through heating.

Thereafter, a second organic light emitting material 402, that is, a green organic light emitting material, is formed on the temporal transfer substrate (TTS) (S304) (FIG. 4(d)). Herein, formation of the second organic light emitting material 402 may be performed by using the same method as formation of the red organic light emitting material 401.

Thereafter, heat is applied to a portion other than the first region and a second region of the temporal transfer substrate (TTS) to remove the second organic light emitting material 402, that is, the green organic light emitting material, formed on the portion other than the first region and the second region on the temporal transfer substrate (TTS) (S305) (FIG. 4(e)).

Thereafter, a third organic light emitting material 403, that is, a blue organic light emitting material, is formed on the temporal transfer substrate (TTS) (S306) (FIG. 4(f)). Herein, formation of the third organic light emitting material 403 may be performed by using the same method as formation of the first and second organic light emitting materials 401 and 402.

Thereafter, the temporal transfer substrate (TTS) is heated to remove the second and third organic light emitting materials 402 and 403 on the first region of the temporal transfer substrate (TTS) and remove the third organic light emitting material 403 on the second region of the temporal transfer substrate (TTS) (S307) (FIG. 4(g)).

A time (or duration) of each heating step S303, S305, and S307 may be long enough to vaporize the removed organic light emitting material on the temporal transfer substrate (TTS), and may be short enough not to affect the organic light emitting material remaining on the temporal transfer substrate (TTS). In this case, heating may be performed at a heating temperature at which a vaporization ratio of the organic light emitting material formed in the region on the temporal transfer substrate (TTS) is 1000 Å/sec or more.

Thereafter, in a state where the first to third organic light emitting materials 401, 402, and 403 are formed on the temporal transfer substrate (TTS), the temporal transfer substrate (TTS) and the display substrate (S) are disposed to closely face each other (S308). In this case, the region in which each organic light emitting material 401, 402, and 403 is formed on the temporal transfer substrate (TTS) is disposed so as to correspond to a region in which each organic light emitting material is to be formed on the display substrate (S). The temporal transfer substrate (TTS) and the display substrate (S) may be spaced apart from each other at a regular interval by pin spacers 405. A distance between the pin spacers 405 may be set to be longer than a heat diffusion distance in the display substrate (S) to prevent heat from affecting the region where heating is not required.

Thereafter, heat is applied to the temporal transfer substrate (TTS) to transfer the first to third organic light emitting materials 401, 402, and 403 on the region of the display substrate (S), in which each organic light emitting material is to be formed, by sublimation (S309) (FIG. 4(h)). In this case, the heating time is long enough to vaporize the first to third organic light emitting materials 401, 402, and 403 formed on the temporal transfer substrate (TTS). Further, in this case, heating may be performed at a heating temperature at which a vaporization ratio at which the first to third organic light emitting materials 401, 402, and 403 formed on the temporal transfer substrate (TTS) are transferred on the display substrate (S) is 1000 Å/sec or less. That is, the heating temperature is adjusted so that sublimation occurs at a slow speed, and the first to third organic light emitting materials 401, 402, and 403 may be deposited by sublimation at a slow speed to reduce porosity of the deposited material and allow deposition of the organic light emitting material to be uniformly distributed, thus forming a high-quality layer on the display substrate (S).

Meanwhile, the temporal transfer substrate (TTS) may be heated by locally passing a current through the resistor elements to generate heat. The resistor elements may be formed of wires or a set of wires, and may have a mesh structure. The resistor elements may be connected to matrix wires that do not cross each other.

The temperature and a temperature change when the temporal transfer substrate (TTS) is heated may be controlled by a change of the current passing through the resistor elements. A sublimation ratio at which the first to third organic light emitting materials 401, 402, and 403 are sublimed from the temporal transfer substrate (TTS) to the display substrate (S) may be controlled by the temperature at this time. Further, the temperature of the temporal transfer substrate (TTS) may be constantly maintained by adjusting the current. Further, the temporal transfer substrate (TTS) may be heated by a plurality of repeated heating pulses.

Figure 5:
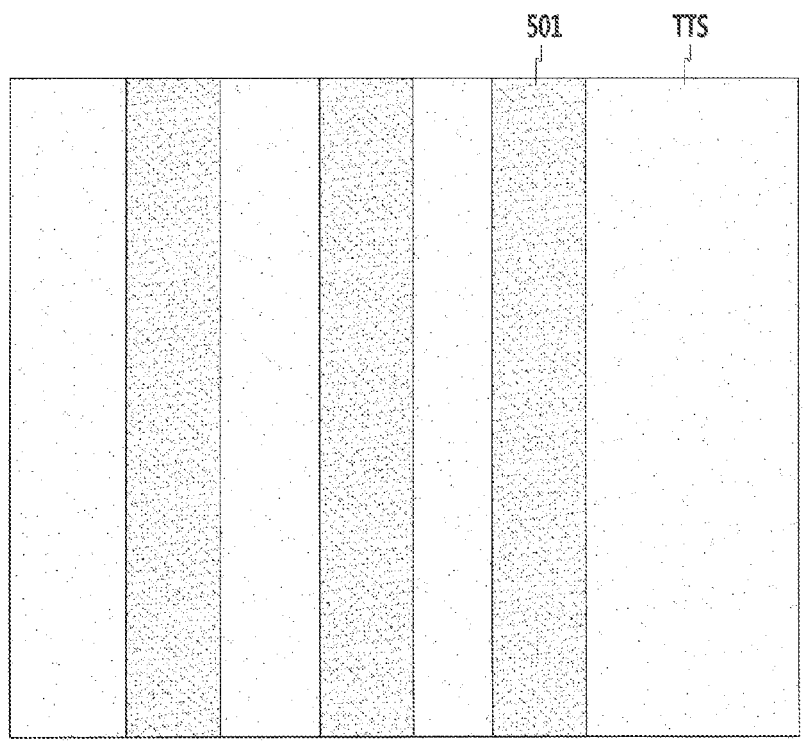
FIG. 5 is a top plan view schematically illustrating an apparatus for forming an organic electro-luminescence pattern according to the exemplary embodiment of the present invention.
Figure 6:
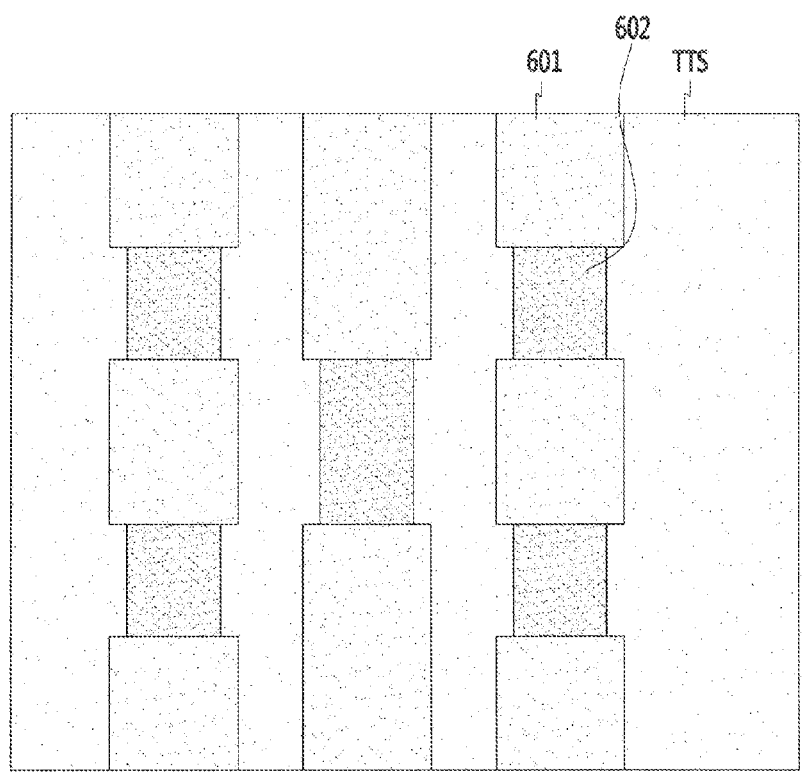
FIG. 6 is a top plan view schematically illustrating an apparatus for forming an organic electro-luminescence pattern according to another exemplary embodiment of the present invention.
Figure 7:
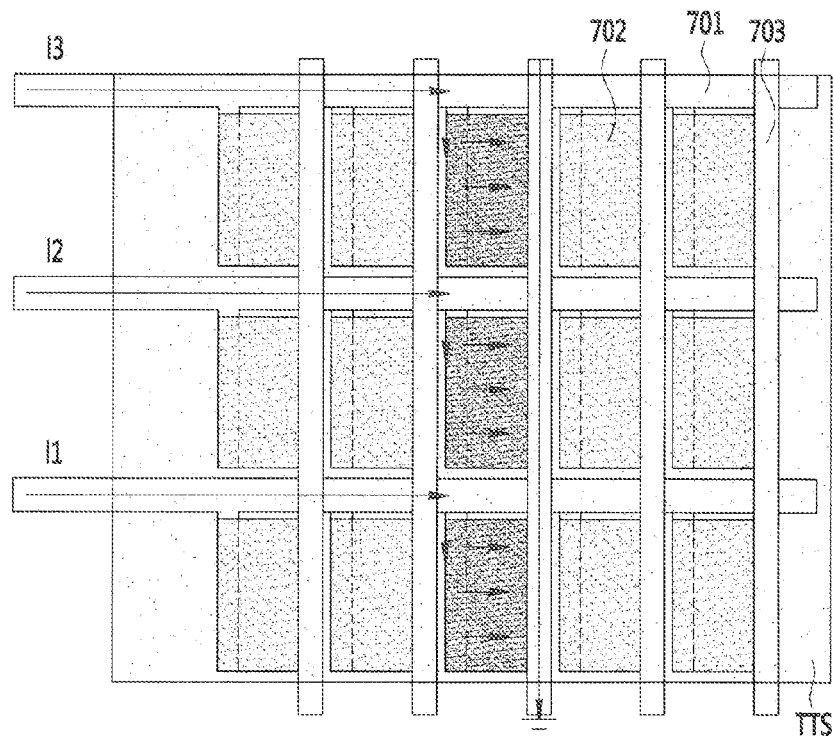
FIG. 7 is a top plan view schematically illustrating an apparatus for forming an organic electro-luminescence pattern according to yet another exemplary embodiment of the present invention.

FIG. 5 is a top plan view schematically illustrating an apparatus for forming an organic electro-luminescence pattern according to the exemplary embodiment of the present invention, FIG. 6 is a top plan view schematically illustrating an apparatus for forming an organic electro-luminescence pattern according to another exemplary embodiment of the present invention, and FIG. 7 is a top plan view schematically illustrating an apparatus for forming an organic electro-luminescence pattern according to yet another exemplary embodiment of the present invention.

Referring to FIGS. 5 to 7, the apparatus for forming the organic electro-luminescence pattern according to the exemplary embodiment of the present invention includes a temporal transfer substrate (TTS) and a heating portion 501. The temporal transfer substrate (TTS) is a transfer subject on which an organic light emitting material is to be transferred on the display substrate (S), and the organic light emitting material may be formed thereon. The temporal transfer substrate (TTS) may have a cross-sectional structure including an upper insulation layer and a lower thermal conductive layer. Further, the temporal transfer substrate (TTS) may include ceramics, glass, or the like, and may have a lamination structure of a metal layer and a ceramic layer.

The heating portion 501 may form a predetermined pattern on the temporal transfer substrate (TTS), and may be formed to apply heat to a region on the temporal transfer substrate (TTS), which corresponds to a region of the display substrate (S), on which the organic light emitting material is not transferred, according to the method of forming the organic light emitting pattern described with reference to FIGS. 1 to 4.

The heating portion 501 may be constituted by resistor elements. Further, the heating portion 501 may be formed of any one selected from the group consisting of tungsten (W), nickel (Ni), chromium (Cr), iron (Fe), or an alloy thereof. The temporal transfer substrate (TTS) may be locally heated by locally passing a current through the resistor elements to generate heat. The resistor elements may be formed of wires or a set of wires.

As illustrated in FIG. 6, a heating portion 602 may be partially covered by a cap 601 to be formed in a predetermined pattern so that heat is applied to a region corresponding to a predetermined cell. That is, heat transfer may be smoothly performed at a portion of the temporal transfer substrate (TTS), which corresponds to a portion of the heating portion 602 covered by the cap 601 by forming the cap 601 by a high conductive material. On the contrary to this, the heating portion may be formed so that heat transfer is reduced or blocked at a portion of the temporal transfer substrate (TTS), which corresponds to a portion of the heating portion 602 covered by the cap 601 by forming the cap 601 by a low conductive or insulating material. Accordingly, heat of the region on the temporal transfer substrate (TTS), which corresponds to each cell, may be individually controlled according to whether or not the cap 601 is present in each wire.

As illustrated in FIG. 7, the resistor elements 702 may have a mesh structure. That is, the heating portion may have a mesh structure where the resistor elements 702 are connected by non-heating electro-conductive wires that cross each other. In FIG. 7, wires 701 in a horizontal direction and wires 703 in a vertical direction may be disposed on the temporal transfer substrate (TTS) in a mesh structure, and currents I1, I2, and I3 may be passed through the wire 701 in the horizontal direction, which corresponds to a desired region on the temporal transfer substrate (TTS) and a current may be passed through a desired region of the wire 703 in the vertical direction to selectively heat the corresponding region by combination of the wire 701 in the horizontal direction and the wire 703 in the vertical direction. Plate-shaped resistor elements 702 may be integrally provided in the wires 701 in the horizontal direction, and heat of the region on the temporal transfer substrate (TTS), which corresponds to each cell, may be individually controlled by passing the current through the selected wire 701 in the horizontal direction and the selected wire 703 in the vertical direction.

Meanwhile, the temporal transfer substrate (TTS) may be heated by a plurality of repeated heating pulses. Heat may be applied to a region corresponding to each row or cell on the temporal transfer substrate (TTS) by applying a repeated and periodical heating electric signal in a pulse form to the wires in one direction or the wires having a mesh structure.

As described above, according to the exemplary embodiments of the present invention, it is possible to form a high resolution structure pattern of an organic light emitting material on a display substrate by deposition using sublimation by constituting wires or a set of wires in one direction or wires or a set of wires having a mesh structure as a heating portion without using a mask.

Further, it is possible to form an elaborate pattern due to a low deposition rate.

Further, it is possible to deposit red (R), green (G) and blue (B) pixel patterns during a single process. Further, it is possible to form an entire structure of a hole transport layer (HTL) and the R, G, B pixel patterns.

Further, it is possible to variously control the deposition ratio of each pixel by controlling a current.

Further, there is provided a rapid and simplified process of depositing an organic light emitting layer having durability.

Further, it is possible to promote an effective use of a deposition material.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming an organic light emitting pattern of an organic electro-luminescence display, comprising:
preparing a display substrate in which a region where a first organic light emitting material is to be formed is defined, and preparing a temporal transfer substrate (TTS) that is a transfer subject on which the first organic light emitting material is to be transferred;
forming the first organic light emitting material on the temporal transfer substrate;
applying heat to a portion other than a first region of the temporal transfer substrate to remove the first organic light emitting material formed on the portion other than the first region as a first heating step;
disposing the temporal transfer substrate and the display substrate to closely face each other; and
applying heat to the temporal transfer substrate to transfer the organic light emitting material on the display substrate by sublimation as a transfer heating step.

2. The method of forming an organic light emitting pattern of an organic electro-luminescence display of claim 1, wherein the first heating step is performed such that vaporizes the first organic light emitting material formed on the portion other than the first region on the temporal transfer substrate, and is performed such that does not affect the first organic light emitting material formed on the first region on the temporal transfer substrate.

3. The method of forming an organic light emitting pattern of an organic electro-luminescence display of claim 1, wherein the transfer heating step is performed such that vaporizes the first organic light emitting material formed on the temporal transfer substrate.

4. The method of forming an organic light emitting pattern of an organic electro-luminescence display of claim 1, wherein the transfer heating step is performed at a temperature at which a vaporization ratio at which the first organic light emitting material formed on the temporal transfer substrate is transferred on the display substrate is 1000 Å/sec or less.

5. The method of forming an organic light emitting pattern of an organic electro-luminescence display of claim 1, wherein the first heating step is performed at a temperature at which a vaporization ratio at which the first organic light emitting material formed on the temporal transfer substrate is transferred on the display substrate is 1000 Å/sec or more.

6. The method of forming an organic light emitting pattern of an organic electro-luminescence display of claim 1, wherein: in the first heating step, the temporal transfer substrate is heated by locally passing a current through resistor elements to generate heat.

7. The method of forming an organic light emitting pattern of an organic electro-luminescence display of claim 6, wherein the resistor elements are formed of wires or a set of wires.

8. The method of forming an organic light emitting pattern of an organic electro-luminescence display of claim 6, wherein the resistor elements have a mesh structure.

9. The method of forming an organic light emitting pattern of an organic electro-luminescence display of claim 8, wherein the resistor elements are connected to matrix wires that do not cross each other.

10. The method of forming an organic light emitting pattern of an organic electro-luminescence display of claim 7, wherein the temperature and a temperature change of the first heating step and the transfer heating step are controlled by a change of the current passing through the resistor elements.

11. The method of forming an organic light emitting pattern of an organic electro-luminescence display of claim 10, wherein a sublimation ratio is controlled by the temperature.

12. The method of forming an organic light emitting pattern of an organic electro-luminescence display of claim 1, wherein the display substrate includes an organic light emitting diode (OLED) display device.

13. The method of forming an organic light emitting pattern of an organic electro-luminescence display of claim 10, wherein the temperature of the temporal transfer substrate is constantly maintained by adjusting the current.

14. The method of forming an organic light emitting pattern of an organic electro-luminescence display of claim 10, wherein the temporal transfer substrate is heated by a plurality of repeated heating pulses.

15. The method of forming an organic light emitting pattern of an organic electro-luminescence display of claim 1, wherein the temporal transfer substrate and the display substrate are spaced apart from each other by pin spacers.

16. The method of forming an organic light emitting pattern of an organic electro-luminescence display of claim 15, wherein a distance between the pin spacers is longer than a heat diffusion distance in the display substrate.

17. The method of forming an organic light emitting pattern of an organic electro-luminescence display of claim 1, wherein the temporal transfer substrate has a structure including an upper insulation layer and a lower thermal conductive layer.

18. The method of forming an organic light emitting pattern of an organic electro-luminescence display of claim 1, further comprising:
   forming a second organic light emitting material on the temporal transfer substrate after the first heating step;
   applying heat to a portion other than the first region and a second region of the temporal transfer substrate to remove the second organic light emitting material formed on the portion other than the first region and the second region of the temporal transfer substrate as a second heating step;
   forming a third organic light emitting material on the temporal transfer substrate; and
   heating the temporal transfer substrate to remove the second and third organic light emitting materials in the first region on the temporal transfer substrate and remove the third organic light emitting material in the second region on the temporal transfer substrate as a third heating step.

19. The method of forming an organic light emitting pattern of an organic electro-luminescence display of claim 18, wherein the first heating step to the third heating step are performed such that vaporizes the removed organic light emitting material on the temporal transfer substrate, and are performed such that does not affect the organic light emitting material remaining on the temporal transfer substrate.

20. The method of forming an organic light emitting pattern of an organic electro-luminescence display of claim 18, wherein the transfer heating step is performed such that vaporizes the first to third organic light emitting materials formed on the temporal transfer substrate.

21. The method of forming an organic light emitting pattern of an organic electro-luminescence display of claim 18, wherein the transfer heating step is performed at a temperature at which a vaporization ratio at which the first to third organic light emitting materials formed on the temporal transfer substrate are transferred on the display substrate is 1000 Å/sec or less.

22. The method of forming an organic light emitting pattern of an organic electro-luminescence display of claim 18, wherein the first heating step to the third heating step are performed at a temperature at which a vaporization ratio of the first to third organic light emitting materials formed in a region on the temporal transfer substrate is 1000 Å/sec or more.

23. The method of forming an organic light emitting pattern of an organic electro-luminescence display of claim 18, wherein in the first heating step to the third heating step, the temporal transfer substrate is heated by locally passing a current through resistor elements to generate heat.

24. The method of forming an organic light emitting pattern of an organic electro-luminescence display of claim 23, wherein the resistor elements are formed of wires or a set of wires.

25. The method of forming an organic light emitting pattern of an organic electro-luminescence display of claim 23, wherein the resistor elements have a mesh structure.

26. The method of forming an organic light emitting pattern of an organic electro-luminescence display of claim 25, wherein the resistor elements are connected to matrix wires that do not cross each other.

27. The method of forming an organic light emitting pattern of an organic electro-luminescence display of claim 24, wherein the temperature and a temperature change of the first heating step to the third heating step and the transfer heating step are controlled by a change of the current passing through the resistor elements.

28. The method of forming an organic light emitting pattern of an organic electro-luminescence display of claim 27, wherein a sublimation ratio is controlled by the temperature.

29. The method of forming an organic light emitting pattern of an organic electro-luminescence display of claim 18, wherein the display substrate includes an organic light emitting diode (OLED) display device.

30. The method of forming an organic light emitting pattern of an organic electro-luminescence display of claim 27, wherein the temperature of the temporal transfer substrate is constantly maintained by adjusting the current.

31. The method of forming an organic light emitting pattern of an organic electro-luminescence display of claim 27, wherein the temporal transfer substrate is heated by a plurality of repeated heating pulses.

32. The method of forming an organic light emitting pattern of an organic electro-luminescence display of claim 18, wherein the temporal transfer substrate and the display substrate are spaced apart from each other by pin spacers.

33. The method of forming an organic light emitting pattern of an organic electro-luminescence display of claim 32, wherein a distance between the pin spacers is longer than a heat diffusion distance in the display substrate.

34. The method of forming an organic light emitting pattern of an organic electro-luminescence display of claim 18, wherein the temporal transfer substrate has a structure including an upper insulation layer and a lower thermal conductive layer.

* * * * *